United States Patent [19]

Clarke et al.

[11] 3,875,657

[45] Apr. 8, 1975

[54] DIELECTRICALLY ISOLATED SEMICONDUCTOR DEVICES

[75] Inventors: Ronald N. Clarke, Woodland Hills; Richard E. Hejmanowski, Cypress, both of Calif.

[73] Assignee: TRW Inc., Los Angeles, Calif.

[22] Filed: Sept. 4, 1973

[21] Appl. No.: 393,924

[52] U.S. Cl. .......................... 29/580; 29/577; 29/578

[51] Int. Cl. .......................... B01j 17/00

[58] Field of Search ........ 29/578, 580, 577, 576 IW

[56] References Cited

UNITED STATES PATENTS

| | | | |
|---|---|---|---|
| 3,313,013 | 4/1967 | Last | 29/580 |
| 3,381,182 | 4/1968 | Thornton | 29/580 |
| 3,387,360 | 6/1968 | Nakamura | 29/580 |
| 3,423,651 | 1/1969 | Legat | 29/580 |
| 3,786,560 | 1/1974 | Cunningham | 29/577 |

*Primary Examiner*—Roy Lake
*Assistant Examiner*—W. C. Tupman

[57] ABSTRACT

A method of fabricating dielectrically isolated integrated circuit devices wherein a highly doped monocrystalline semiconductor wafer of a predetermined conductivity type and a substrate of polycrystalline semiconductor material are separated by an insulating layer of silicon dioxide. A working layer of semiconductor material of the same conductivity type, but of a lower impurity concentration as the monocrystalline semiconductor wafer is expitaxially deposited onto the monocrystalline semiconductor wafer after which a plurality of semiconductor devices are formed in the monocrystalline epitaxial layer. A portion of the working epitaxial layer is chemically etched away to expose a portion of the highly doped monocrystalline semiconductor wafer. Isolation moats between each of the semiconductor devices are formed by a second chemical etching step and conductive connections are formed to active portions of each semiconductor device.

14 Claims, 10 Drawing Figures

DIELECTRICALLY ISOLATED SEMICONDUCTOR DEVICES

BACKGROUND OF THE INVENTION

1. Field of the Invention

This invention relates to the fabrication of dielectrically isolated monolithic semiconductor circuit network and more particularly to the achievement of dielectrical isolation while retaining thickness and planarity control of the working layer and to the fabrication of an integrated circuit having improved characteristics provided by a novel application of an oxide or nitride controlled etching process.

2. Prior Art

There have been a number of prior art approaches to the problem of isolating active elements in an integrated circuit. One prior art approach for electrically isolating electrically active elements is disclosed in U.S. Pat. No. 3,158,788 issued to J. T. Last on Nov. 24, 1964. Last employs a barrier of added dielectric insulating material to isolate the elements of the circuit. While this method has definite advantages, it does not provide working layers which are thin enough for microwave applications and have low elemental density. Other prior art patents such as U.S. Pat. No. 3,100,276 issued to O. L. Meyer on Aug. 6, 1963 and U.S. Pat. No. 3,189,798 issued to C. E. Benjamin on June 15, 1965 have attempted various arrangements of grooves alone or in combination with pn junctions to junction isolate the active devices of an integrated circuit.

U.S. Pat. No. 3,695,160 issued to Sloan, Jr. et al. on Apr. 25, 1972, teaches an orientation dependent etching technique employed in the fabrication of a monolithic semiconductor circuit network to provide electrical isolation along with an increase in elemental density. The electrical isolation is obtained by an epitaxial layer of one conductivity type placed on a substrate of an opposite conductivity type. This patent does not teach dielectric isolation of semiconductor devices.

U.S. Pat. No. 3,416,224 issued to Armstrong et al. on Dec. 17, 1968 teaches a method of fabricating dielectrically isolated integrated semiconductor devices. The Armstrong device comprises a monocrystalline wafer, upon which an oxide layer is grown or deposited, mounted on a polycrystalline substrate. The wafer is doped with donor and acceptor impurities to form p-type and n-type regions. The devices are chemically etched to the polycrystalline substrate through an oxide layer to dielectrically isolate each device. This is presently one of the standard techniques for dielectrically isolating semiconductor devices. Difficulties have arisen in applying this technique to the fabrication of microwave semiconductor devices because the monocrystalline substrate must be of a controlled thickness to allow the manufacture of matched microwave devices.

U.S. Pat. No. 3,489,961 issued to Frescara et al. on Jan. 13, 1970 teaches dielectric isolation for semiconductor devices. The patent discloses the steps of:

1. depositing an n+-type epitaxial layer onto an n-type monocrystalline substrate;
2. depositing a second n-type epitaxial layer onto the first epitaxial layer and doping the second n epitaxial layer with donor and acceptor impurities to form p-type and n-type regions in the semiconductor devices;
3. forming an oxide mask exposing regions for metalization;
4. metalizing these regions to form ohmic contacts to the p-type and n-type regions of the semiconductor devices;
5. adhering the monocrystalline substrate to a glass or oxide coated supporting substrate; and,
6. etching grooves to the oxide layer of the supporting substrate to isolate each semiconductor device.

This prior art method has the advantage of providing a high elemental density with isolation comparable to that achieved by dielectric isolation. The increased packing density is achieved by making the semiconductor material associated with the semiconductor devices as thin as possible and by the inclusion of indicating grooves which indicate the approximate depth of the device. The semiconductor material contained in the semiconductor device is also made as thin as possible in order to limit the amount of etching required. A lapping process enables the semiconductor devices to be formed on a relatively flat surface whereby precise etching, photo-engraving and diffusing techniques can be employed.

The principal disadvantage of the above disclosed prior art method is the difficulty in obtaining and maintaining thin working layers with a tolerance of ± one tenth of a micron in a dielectrically isolated region three to seven microns thick as is required for a microwave device. Further, the collector diffusion is an extra heat treatment step, the elimination of which would enhance the yield of the process.

U.S. Pat. No. 3,579,391 entitled "Method of Producing Dielectric Isolation For Monolithic Circuit" issued to James L. Buie on May 18, 1971 teaches another method of conventional dielectric isolation of semiconductor devices for microwave applications.

The method includes the steps of:

1. forming a moat on a first surface of an n-type monocrystalline silicon substrate;
2. depositing and diffusing collector contact;
3. growing an isolating layer of silicon dioxide over the first surface of the substrate;
4. depositing a polycrystalline silicon on the oxide layer;
5. lapping the exposed second surface of the monocrystalline silicon substrate to the desired thickness which is generally larger than five to seven microns to form a dielectrically isolated n-type working pocket of n-type monocrystalline silicon.
6. doping the n-type working layer with donor and acceptor impurities to form p-type and n-type regions in the semiconductor devices.

One object in isolating the semiconductor devices is to achieve a controlled thickness; but this has proved difficult, i.e., to obtain semiconductor layers of five to seven microns to within one tenth of a micron. Prior art processes result in relatively low yield for this reason.

In all methods of the prior art the basic problem is to control the thickness of dielectrically isolated regions of the semiconductor device so that they may be used for microwave applications. It should be noted that the other patents have drawings which are not drawn to scale and that semiconductor layers of five to seven microns are difficult to achieve and are in fact not realized by any of the prior art methods.

The present invention combines the use of an epitaxial technique and a mesa etching technique to produce semiconductor devices which are necessary for microwave applications.

Conventional dielectric isolation is achieved by complicated processes which cannot achieve sufficient precision for microwave applications. The goal is to produce a monolithic structure with isolated devices on a single chip for inclusion in low distortion microwave amplifiers. The new method of the present invention offers simpler construction techniques and lower parasitics for improved performance.

It is, therefore, an object of the present invention to achieve dielectric isolation of thin layers on a single chip multi-element integrated circuit.

It is still another object of the invention to use a polycrystalline substrate on the back of the working monocrystalline epitaxial layer in a non-critical fashion.

It is also an object of the invention to replace both the polycrystalline deposition onto the insulated active layer of the monocrystalline substrate and the critical backlap by a non-critical polycrystalline deposition on the back of the insulated epitaxial substrate.

SUMMARY OF THE INVENTION

Various prior art methods have been used to dielectrically isolate semiconductor devices on a substrate. These various methods have used a single chemical etching process and an oxide process or a critical backlapping process to achieve dielectrical isolation of the semiconductor devices. The present invention makes use of insulation and epitaxial deposition processes on the semiconductor wafer to provide a base for semiconductor devices to be electrically isolated by an oxide or nitride controlled chemical etching process. As in the prior art, a monocrystalline silicon substrate has an insulating layer of silicon dioxide grown on one of its surfaces and has a layer of polycrystalline silicon deposited on the silicon dioxide layer. The epitaxial layer is formed on the opposite surface of the monocrystalline semiconductor substrate. The planarity and thickness of the epitaxial layer is controllable to within plus or minus one tenth of a micron. A plurality of semiconductor devices are then formed in the epitaxial layer. During the process a number of silicon dioxide layers are grown or deposited over the plurality of semiconductor devices.

In the preferred method of isolating the plurality of the semiconductor devices as taught by the present invention the portion of the epitaxial layer which is to be removed in the first chemical etching is exposed by removing the silicon dioxide layer by standard techniques. The exposed portion of the epitaxial layer is then chemically etched. After the first chemical etching another silicon dioxide layer is grown over the entire silicon substrate. A portion of the silicon substrate which is to be removed is exposed by removing the silicon dioxide by standard techniques. The exposed portion of the silicon substrate is then chemically etched to the silicon dioxide layer between the monocrystalline silicon substrate and polycrystalline silicon layer.

The first chemical etching removes the epitaxial layer exposing the high conductivity substrate which becomes a collector contact for each semiconductor device and the second chemical etching of the monocrystalline silicon substrate achieves electrical isolation of the semiconductor devices. Finally, standard metalization and oxide coating techniques are used to produce a completed device. These semiconductor devices are useful in microwave applications because they can be electrically matched.

In accordance with the present invention there is also provided an arrangement of dielectrically isolated semiconductor devices on a handle substrate formed by the polycrystalline silicon layer which serves as support for the semiconductor devices mounted thereon. Each of the semiconductor devices may be further dielectrically isolated from the other devices by the deposition of silicon dioxide into the moat or channel region formed between each of the devices. The foregoing and other objects and featured advantages of the present invention will be apparent from the following more particular description of preferred embodiment of the invention as illustrated in the accompanying drawings.

DESCRIPTION OF THE PREFERRED EMBODIMENT

Figure 1:
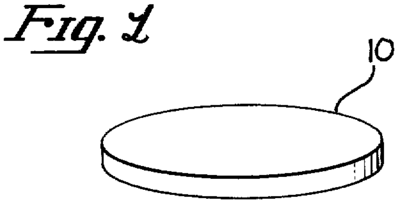
FIG. 1 is a perspective view of a monocrystalline semiconductor wafer after having been cut from a single crystal and polished to a mirror finish.
Figure 2:
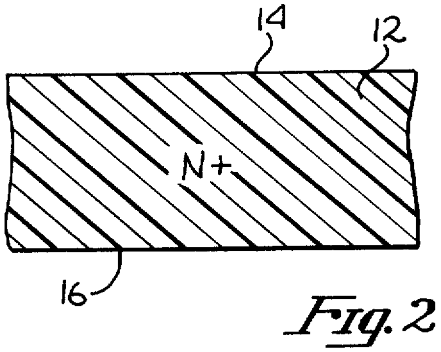

The background of the present invention can best be understood by reference to FIGS. 1 through 7 of the drawings. Monocrystalline silicon wafer 10 is shown in FIG. 1 after its initial preparation by a standard technique. FIG. 2, a diagrammatic cross-sectional view, shows wafer 10 having a region 12 of high conductivity type (e.g., n+ type). Wafer 10 has surfaces 14 and 16, which are generally parallel, and functions to provide a conductivity path to collectors of integrated circuits to be formed on surface 14.

Figure 3:
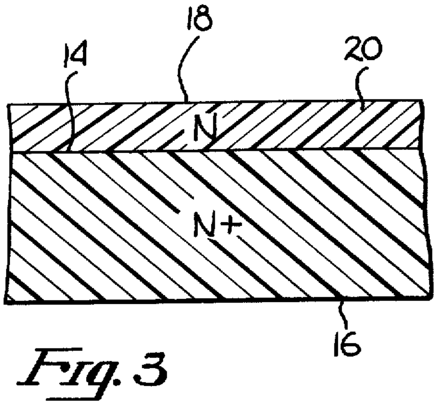
Figure 4:
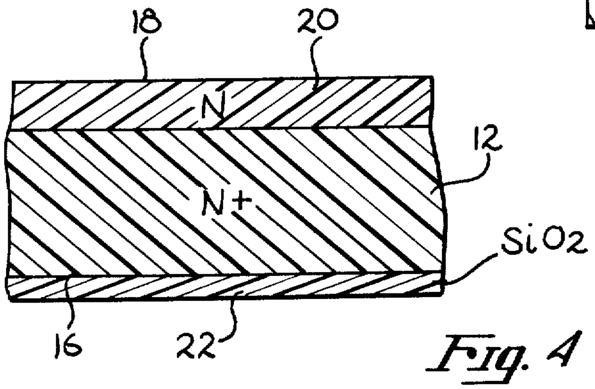

A first step in the processing in accordance with a presently preferred embodiment of the present invention is to epitaxially deposit a relatively thin layer (e.g., 5 to 7 microns) of n conductivity type silicon on surface 14 of wafer 10. This layer is shown in FIG. 3 as layer 20 having an exposed surface 18. The wafer 10 is then placed in an epitaxial reactor with the surface 16 up and the wafer etched until the thickness of layer 12 is reduced to about 1 mil. Next, an insulating layer of silicon dioxide 22 is formed on surface 16 of the wafer 10 as may be seen in FIG. 4.

Figure 5:
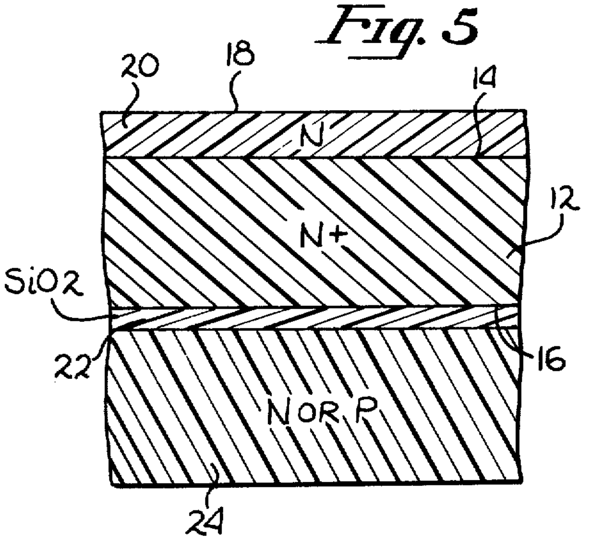
FIGS. 2, 3, 4, 5, 6 and 7 are greatly enlarged fragmentary, diagrammatic cross-sectional views of a monocrystalline silicon wafer illustrating intermediate processing stages in the fabrication of the structure of the invention.

A polycrystalline layer 24 of either n- or p-type material is then deposited over the insulating layer 22 as seen in FIG. 5. The polycrystalline layer 24 becomes the mechanical member of the finished product and serves to hold the various electrically isolated devices together.

It may be found desirable to alter the order of the preceding steps in order to eliminate any possibility of n+ diffusion from wafer 10 into the epitaxial layer 20. This can be accomplished by first forming insulating layer 22 on surface 16, then forming polycrystalling layer 24 over layer 22, etching the layer 12 to a thickness of about 1 mil and finally epitaxially depositing layer 20. Subsequent processing is identical, irrespective of the order of the initial layer formation.

In the preferred embodiment described, insulating layer 22 isolates the devices being fabricated from layer 24 and thus the electrical characteristics of layer 24 are immaterial. An alternate embodiment of the invention, however, does not include layer 22 and in such case layer 24 must be of opposite conductivity type as the wafer 10 in order that electrical isolation from the active circuit may be preserved.

Figure 6:
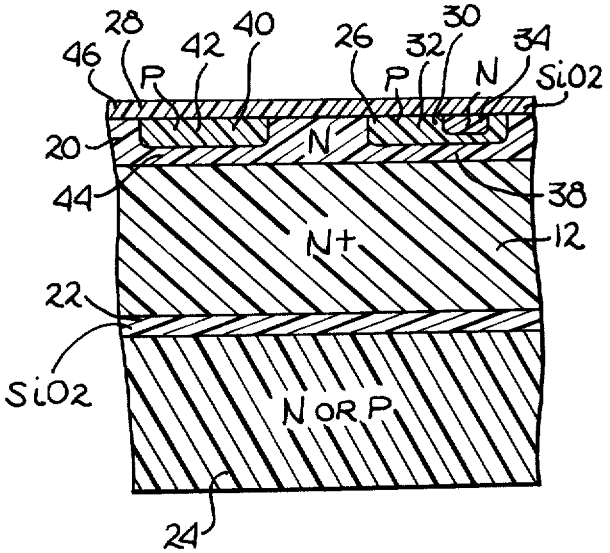

After formation of the handle layer 24, the devices which comprise the circuit to be fabricated are formed in layer 20. FIG. 6 illustrates, as an example, an integrated circuit network comprising transistor 26 and diode 28 which have been formed in region 20. The transistor 26 may be formed by a controlled diffusion of a selected impurity into first portion 30 of region 20 to form base region 32 and a subsequent and more limited area diffusion of an impurity of opposite conductivity type into first portion 34 of base region 32 to form emitter region 36. Region 20, as previously mentioned, has a suitable impurity deposited therein through which to impart the desired conductivity type so that it may function along with region 12 as collector region 38 of transistor 26. Similarly, diode 28 may be formed by a controlled diffusion of a selected impurity into second portion 40 of region 20 to form cathode region 42. Region 20 along with region 12 functions as anode region 44 of diode 28. The devices 26 and 28 are shown protected by an oxide layer 46 which covers the entire surface 18. In the instance where region 20 is comprised of monocrystalline silicon, oxide layer 46 is comprised of silicon dioxide and has electrical characteristics such that it properly isolates electrical connections which are located thereon from the remaining portions of the circuit.

Figure 7:
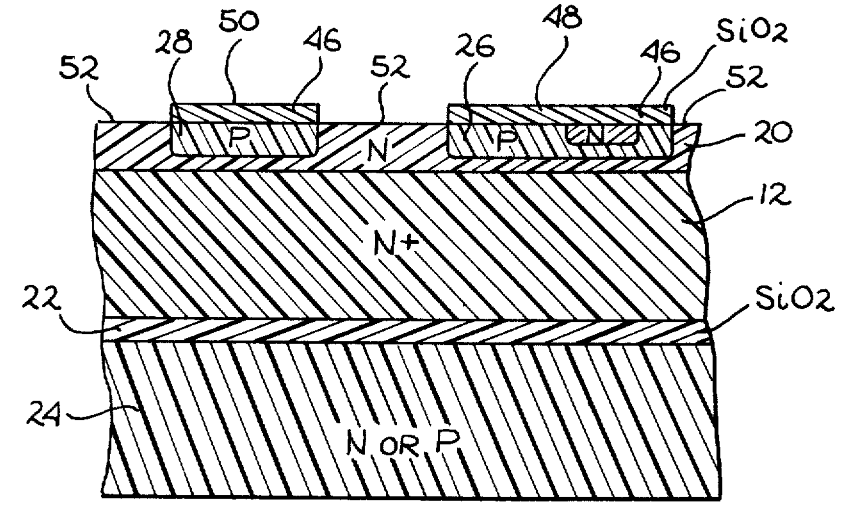

In FIG. 7, portions of silicon dioxide layer 46 that are not covering transistor 26 and diode 28 in epitaxial layer 20 are removed by standard silicon dioxide etching techniques to form transistor mask 48 and diode mask 50.

Figure 8:
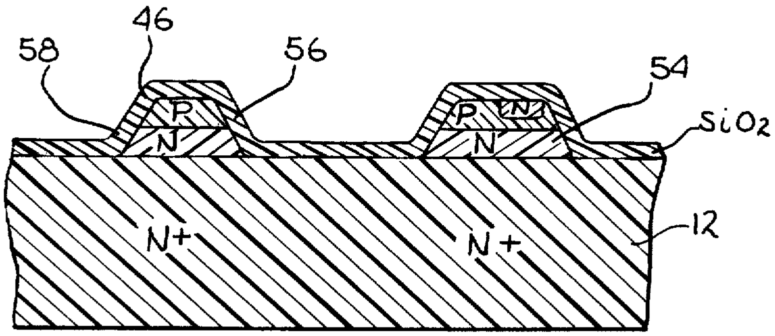
FIG. 8 is a greatly enlarged diagrammatic cross-sectional view of the wafer shown in FIGS. 1 through 7 illustrating the first etching step in the fabrication of the structure of the invention.
Figure 9:
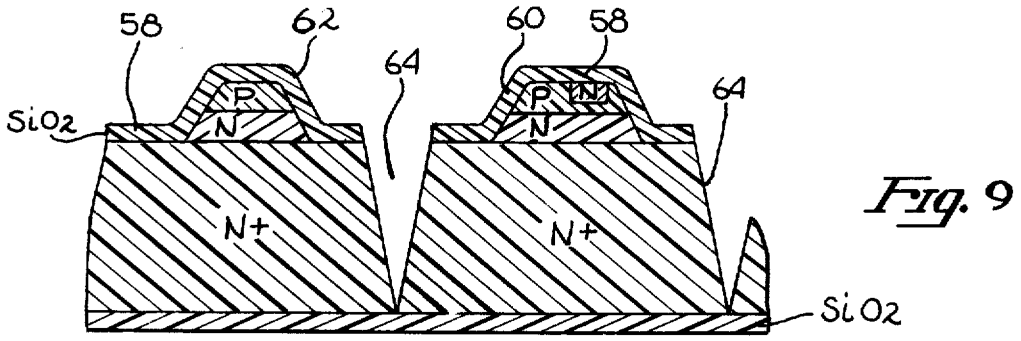
FIG. 9 is a greatly enlarged diagrammatic cross-sectional view of the wafer shown in FIGS. 1 through 8 illustrating the second etching step in the fabrication of the structure of the invention.

Unmasked portions 52 of epitaxial layer 20 are shown chemically etched to surface 14 of silicon substrate 10 in FIG. 8. Transistor mesa 54 and diode mesa 56 are comprised of the unetched portions of epitaxial layer. This mesa etching of both the diode and transistor increases the breakdown voltages by eliminating radius of curvature limitations. Transistor mesa 54 and diode mesa 56 are comprised of the unetched portions of epitaxial layer 20. Silicon dioxide layer 58 is grown over surface 14 and mesas 54 and 56 of wafer 10. Portions of layer 68 which surround the devices to be isolated (diode 26 and transistor 28 in the example being described) are removed by standard techniques and the exposed semiconductor material of layer 12 etched away, until the insulating layer 22 is exposed, thus forming channels 64 surrounding the devices to be isolated. If, as previously suggested, insulating layer 22 is not used, the etching is performed until polycrystalline handle layer 24 is exposed.

Figure 10:
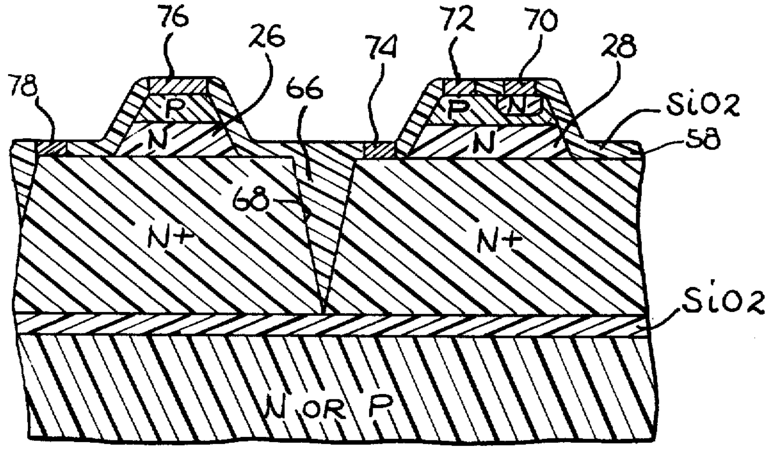
FIG. 10 is a greatly enlarged diagrammatic, cross-sectional view of the wafer shown in FIGS. 1 through 9 illustrating a completed structure of the invention.

The channels 64 may subsequently be filled in with silicon dioxide 66 as shown in FIG. 10. FIG. 10 also shows contacts 70, 72, 74, 76 and 78 to regions 36, 32, 38, 42 and 44, respectively, which are formed by standard metalization techniques, through silicon dioxide layer 58.

The primary advantage of the present invention is realized because the planarity and thickness of the epitaxial layer can be controlled to within one tenth of a micron. This leads to uniformity in the resulting semiconductor devices such that they are useful in microwave applications. A second advantage is realized by the use of an epitaxial active layer because the epitaxial layer can be uniformly doped with impurities to provide any desired conductivity. A third advantage is the elimination of radius of curvature limited breakdown by the mesa etching procedure.

While the invention has been particularly shown and described with reference to preferred embodiment thereof, it will be understood by those skilled in the art that various changes in form and details may be made therein without departing from the spirit of the invention.

What is claimed is:

1. A method for fabricating a semiconductor structure containing a plurality of electrically isolated semiconductor devices which comprises:

a. forming a wafer of high conductivity first type semiconductor material;

b. epitaxially depositing a first layer of lower conductivity material of first conductivity type on the first surface of said wafer;

c. forming a second layer of material on the second surface of said wafer, said second layer of material being non-electrically conductive with respect to separated points of said wafer;

d. forming a plurality of semiconductor devices on said epitaxial layer; and e. removing a portion of said first layer whereby the underlying portion of said wafer will be exposed;

f. etching a groove along a part of said exposed portion between at least two of said semiconductor devices, said groove extending from first surface of said wafer to said second layer of material whereby said semiconductor devices separated by said groove will be electrically isolated, while leaving at least a part of said exposed portion between said two devices; and g. making an ohmic contact to said remaining part of said exposed portion of said wafer.

2. The method of claim 1 where said second layer comprises semiconductor material of opposite conductivity type as said wafer.

3. The method of claim 1 where said second layer comprises an insulating material.

4. The method of claim 3 and further including the step of forming a third layer of semiconductor material over said second layer whereby extra mechanical strength will be imparted to said structure.

5. The method of claim 4 and further including the step of etching said wafer on its second surface prior to forming said second layer whereby the thickness of said wafer is reduced.

6. The method of claim 5 where said ohmic contact is made prior to etching of said groove.

7. The method of claim 6 and further including the step of filling said groove with insulating material.

8. The method of claim 7 where said semiconductor material is silicon.

9. The method of claim 8 where said second layer is silicon dioxide.

10. The method of claim 2 and further including the step of etching said wafer on its second surface prior to forming said second layer whereby the thickness of said wafer is reduced.

11. The method of claim 10 where said ohmic contact is made prior to etching of said groove.

12. The method of claim 11 and further including the step of filling said groove with insulating material.

13. The method of claim 12 where said semiconductor material is silicon.

14. A method for fabricating a semiconductor structure containing a plurality of electrically isolated semiconductor devices which comprises the steps of:

a. forming a wafer of high first conductivity type silicon;

b. epitaxially depositing a first layer of lower conductivity silicon of first conductivity type on the first surface of said wafer;

c. etching the second surface of said wafer whereby the thickness of said wafer is reduced;

d. depositing a second layer of silicon dioxide on said second surface;

e. depositing a third layer of polycrystalline silicon on said second layer;

f. forming a plurality of semiconductor devices on said first layer;

g. removing said first layer over a portion of the surface of said wafer whereby an underlying portion of said wafer will be exposed;

h. interconnecting said semiconductor devices one connection to each of said devices being made to said exposed portions of said wafer;

i. etching a groove along a part of said exposed portion between at least two of said semiconductor devices from the first layer side of said structure, said groove extending to said second layer whereby said semiconductor devices separated by said groove will be electrically isolated while leaving at least that part of said exposed portion having said one connection;

j. filling said groove with silicon dioxide.

* * * * *